United States Patent [19]

Lemberger et al.

[11] Patent Number: 4,625,315

[45] Date of Patent: Nov. 25, 1986

[54] APPARATUS AND CIRCUITRY FOR STABILIZING LASER DIODE OUTPUT FOR ANALOG MODULATION

[75] Inventors: Richard R. Lemberger; Paul C. Schubert; Steven R. Tobin, all of St. Paul, Minn.

[73] Assignee: Minnesota Mining and Manufacturing Company, St. Paul, Minn.

[21] Appl. No.: 644,873

[22] Filed: Aug. 27, 1984

[51] Int. Cl.$^4$ .............................................. H01S 3/00
[52] U.S. Cl. ...................................... 372/38; 372/18; 372/26; 372/31; 372/33
[58] Field of Search ...................... 372/18, 26, 27, 29, 372/31, 32, 33, 38

[56] References Cited

U.S. PATENT DOCUMENTS

| | | | |
|---|---|---|---|
| 4,109,217 | 8/1978 | Brackett et al. | 372/31 |
| 4,237,427 | 12/1980 | Holland | 372/26 |
| 4,347,610 | 8/1982 | Meuleman | 372/29 |
| 4,369,525 | 1/1983 | Breton et al. | 372/29 |
| 4,450,564 | 5/1984 | Meuleman et al. | 372/29 |

OTHER PUBLICATIONS

Lutz, et al; "Modulated Light Source for Recording with GaAlAs Lasers"; Jun. 1981.

Primary Examiner—William L. Sikes
Assistant Examiner—Robert E. Wise
Attorney, Agent, or Firm—Donald M. Sell; James A. Smith; Robert L. Marben

[57] ABSTRACT

Circuitry and apparatus for stabilizing the output of a laser diode when modulated with a wideband analog signal. The circuitry provides for continuous operation of the laser diode with a pin diode positioned for receiving a portion of the output from the laser diode via optics positioned between the laser diode and the pin diode. The optics includes a collimator, a linear polarizer and a polarization beam splitter. The circuitry includes a high gain amplifier which receives the analog signal with a compensating network connected between the amplifier output and the laser diode. The circuitry also has a feedback circuit portion including the pin diode connected to one input of the amplifier.

6 Claims, 3 Drawing Figures

APPARATUS AND CIRCUITRY FOR STABILIZING LASER DIODE OUTPUT FOR ANALOG MODULATION

BACKGROUND OF THE INVENTION

The invention presented herein relates to arrangements for stabilization of the output of an injection laser (laser diode) when modulated with a wideband analog signal.

An acceptable laser output stabilization arrangement must correct for long and short term changes in laser diode operating characteristics if the laser diode is to be usable for modulation by a wideband analog signal. Over the long term, the slope of the curve of laser diode power output versus input current tends to decrease with the age of the laser diode. In addition, the lasing threshold current tends to increase with age.

Short term variations in the laser diode operating characteristics can occur in response to junction temperature changes. Junction temperature changes due to self-heating or ambient temperature fluctuations can cause continuous changes in the power output of the laser diode for fixed input current. These continuous changes are equivalent to a shift to the right of the power-current curve with increasing junction temperature.

In addition to the continuous changes, some single-mode laser diodes exhibit abrupt power-output fluctuations of a few percent of maximum power due to "hopping" between longitudinal modes of the laser cavity. In a given external optical setup, these mode hops occur at particular junction temperatures, with the junction temperature being dependent primarily on the recent history of junction self-heating.

Various feedback arrangements for stabilizing the laser diode output are disclosed in the prior art which involve monitoring the output of the laser diode by directing a portion of the light emitted from the front or back facets of the laser diode to a pin diode. Some laser diodes are provided with an internal diode for such use. In the case of laser diodes driven from digital data sources, the feedback arrangements are provided to maintain average power levels. Such arrangements, of course, only provide correction for long term changes in laser diode operating characteristics and do not provide immediate or continuous correction for abrupt power-output fluctuations due to "hopping" between longitudinal modes of the laser cavity or power level changes due to short term temperature fluctuations.

A paper entitled "Modulated Light Source For Recording With GaAlAs-Lasers" by M. Lutz, B. Reimer, and H. P. Vollmer which was presented at the "First International Congress on Advances in Non-Impact Printing Technologies" held at Venice, Italy in June 1981, discloses an electronic circuit employing the pin diode that is built into the laser diode assembly. A feedback arrangement is described wherein the pin diode monitors the light output from the back mirror of a laser diode to stabilize the light output of the laser diode. This paper recognizes the need for rapid stabilization of the laser output for printer applications. A control circuit is disclosed which keeps the laser diode operating all the time so a feedback signal is always present and is indicated as providing a feedback loop having a time constant that is much less than 300 nanoseconds. The rise and fall times for this circuit are given as 150 and 300 nanoseconds, respectively.

While the prior art appears to teach how one might obtain regulation of the output of a laser diode making it suitable for non-impact printers, such teachings fall short with respect to how satisfactory control of the laser diode output can be obtained for applications using analog input signals wherein feedback corrections in less than 40 nanoseconds are desired. The prior art also fails to teach a solution to the problem presented due to mode "hopping" between longitudinal modes of the laser cavity.

SUMMARY OF THE INVENTION

The invention presented herein represents an advance over the prior art with respect to several aspects or features that are employed in one embodiment of the invention which provides for analog modulation of a laser diode at rates up to several million samples per second with precise control over the power output that is provided in part by a feedback arrangement wherein corrections are made in less than 40 nanoseconds with a closed-loop rise time of less than 50 nanoseconds.

The attainment of such control of the laser diode output is provided in part by the present invention by the manner in which a portion of the laser diode light power output is obtained for use in developing a feedback signal. Since continuous control of the output is sought, the problem presented by abrupt power output fluctuations due to "hopping" between longitudinal modes of the laser cavity must be addressed. It has been discovered that this problem is minimized by the present invention wherein a linear polarizer is positioned before a polarization beam splitting element to provide a portion of the laser diode main output to a pin diode with the axis of the linear polarizer aligned parallel to the axis of polarization of the light from the laser diode. This allows the use of a very efficient polarization beam splitter to split off the feedback portion of the output beam at 90 degrees to the main output beam. With this arrangement polarization angle changes due to mode "hopping" are presented as intensity changes as far as optics downstream from the linear polarizer are concerned for which correction can be made by the use of the circuitry of the present invention.

Another feature of the invention resides in the feedback circuitry that uses detection of the photo-induced current produced by the pin diode. The circuitry provided by the invention serves essentially to cancel the adverse effect of the junction capacitance of the pin diode on the speed at which such circuitry responds to changes in the pin diode current.

The circuit provided for control of the laser diode output also uses a high speed gain element, a constant-current source for supplying the laser diode with a quiescent current at a point corresponding to about half of the maximum power output, and a compensating network for increasing circuit stability and speed.

BRIEF DESCRIPTION OF THE DRAWING

The novel features and advantages of the invention presented herein will become more apparent to those skilled in the art upon consideration of the following detailed description and referenced drawing wherein.

DETAILED DESCRIPTION

Figure 1:
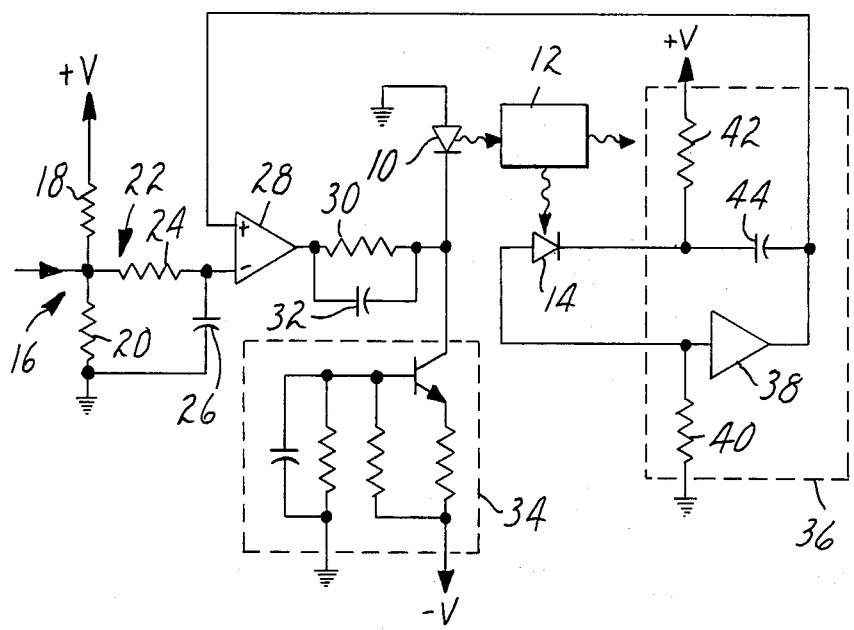
FIG. 1 is a schematic of one embodiment of the invention wherein the optics apparatus portion is shown as a single block.
Figure 2:
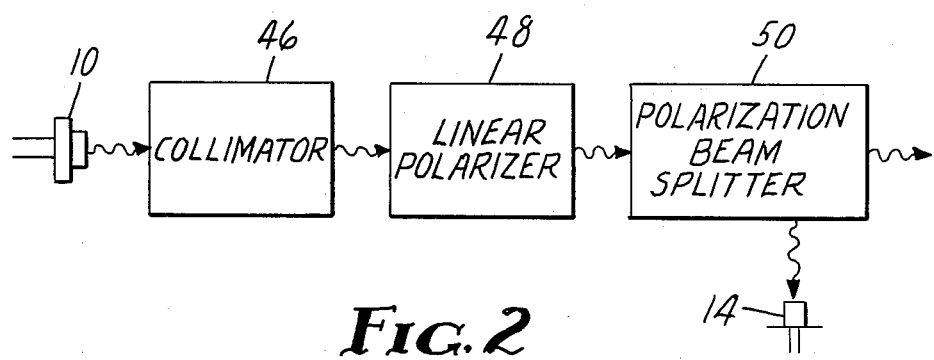
FIG. 2 is a block diagram showing more detail of the optics used in the embodiment of FIG. 1.

Referring to FIG. 1 of the drawing, details of the circuitry portion for stabilization of the output of a laser diode 10 are shown. FIG. 2 shows details of the apparatus portion, indicated by the block 12, which involves the optics for directing a portion of the main beam output of the laser diode 10 to the pin diode 14 used in the circuitry of FIG. 1.

The circuitry of FIG. 1 includes a voltage input bias network 16 that is provided by two series connected resistors 18 and 20 with resistor 18 connected to a positive d.c. voltage and resistor 20 connected to ground. The connection common to the resistors 18 and 20 receives an analog input signal for control of the laser diode 10. The bias network 16 provides a small d.c. offset to the circuit so the laser diode output power will not be turned off, but will drop to its threshold level when the analog input signal goes to zero. A low-pass filter 22 is provided by a resistor 24 and capacitor 26 in conjunction with the impedance looking back at the input to the circuit of FIG. 1. One end of resistor 24 is connected to the connection common to resistors 18 and 20 with the other end of resistor 24 connected to one side of capacitor 26, which has its other side connected to ground. The low-pass filter serves to improve the closed-loop response of the circuitry in FIG. 1 in that it reduces residual peaking to expand the high end of the frequency band over which a flat gain is provided. A high-gain differential amplifier 28 is provided which has its inverting input connected to the connection common to capacitor 26 and resistor 24 with its non-inverting input connected to receive a feedback signal for stabilizing the output of the laser diode 10. The output of the differential amplifier 28 is connected to a capacitor 32 that is connected in parallel with a resistor 30 which provides a compensating network for increasing the speed and stability of the circuitry. A current source, indicated at 34, is connected to the cathode of the laser diode 10 and is also connected to the output end of the parallel connected resistor 30 and capacitor 32. The current source 34 includes an NPN transistor that is biased to provide the laser diode 10 with a current, when the output of amplifier 28 is zero, that is equal to the level required for half of the maximum output power of the laser diode. This means the current output that otherwise would be required by the amplifier 28 is reduced to provide a larger selection of high gain amplifiers that are usable in the circuit of FIG. 1. The current source 34 need not be used if an amplifier 28 is selected that has the required output current rating.

Current produced by the pin diode 14 in response to the light output received from the laser diode 10 via the optics portion 12 is transformed to a positive feedback voltage by the circuit portion 36. The circuit portion 36 minimizes the effects of the pin junction capacitance thereby extending the frequency response of the pin diode. The portion 36 includes a high speed unity gain buffer amplifier 38, a resistor 40, a resistor 42 and a d.c. blocking capacitor 44. Amplifier 38 has an input connected to the anode of the pin diode 14. A current path through the pin diode 14 is provided by resistors 40 and 42. Resistor 40 is used to sense the current in the pin diode and is connected between ground and the anode of the pin diode 14. Resistor 42 is connected between a positive d.c. voltage and the cathode of the pin diode. The d.c. blocking capacitor 44 is connected between the pin diode 14 end of the resistor 42 and the output of amplifier 38 which connects to the non-inverting input of the differential amplifier 28. The resistor 42 and capacitor 44 serve substantially to reduce the voltage variations across the pin diode 14. The RC time constant provided by resistor 42 and capacitor 44 should be made much greater than any other time constants in the circuit portion 36. With this condition and for a gain of one for the amplifier 38, the response speed of the circuit portion 36 is optimized.

The compensating network provided by the resistor 30 and capacitor 32 parallel combination uses a value for resistor 30 that is much greater than the sum of the output impedance of the amplifier 28 and the dynamic impedance of the laser diode 10. The open-loop gain of the circuitry of FIG. 1 is then approximately inversely proportional to the magnitude of resistor 30. The resistor 30 also serves as a current limiter for the laser diode 10. The value for capacitor 32 is selected so as to provide a zero in the open-loop gain which cancels out a pole due to the response of the pin diode 14.

Figure 3:
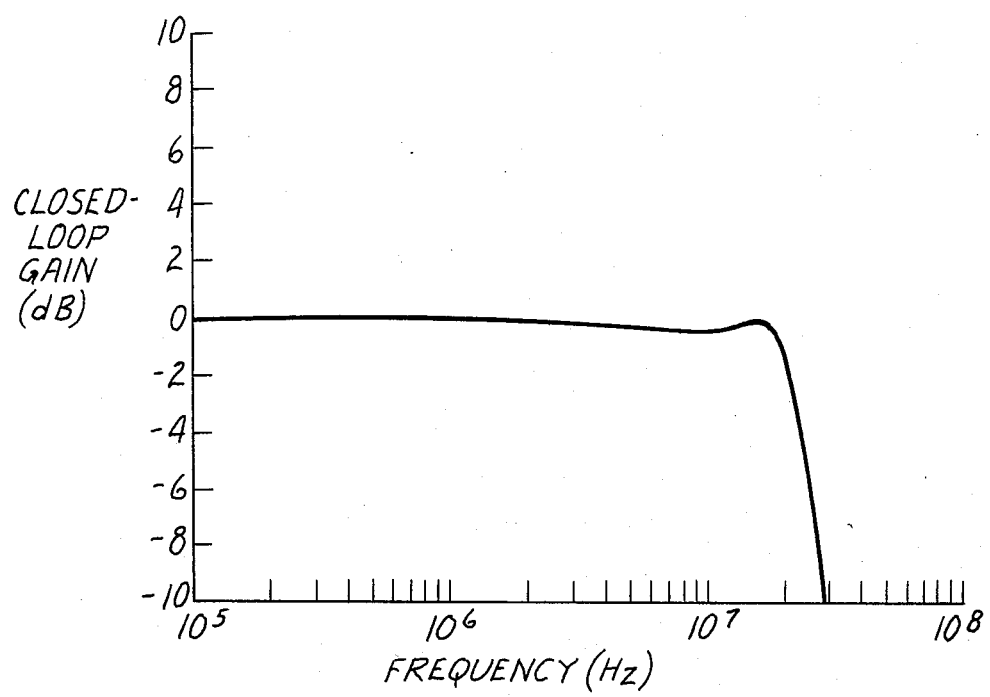
FIG. 3 is a closed-loop gain versus frequency response for the embodiment of FIG. 1.

Referring to FIG. 3, the closed-loop gain versus frequency for the circuitry embodying the invention presented herein is shown wherein the gain is essentially flat with the 3b point on the curve being at about $20 \times 10^6$ Hertz.

Referring to FIG. 2, the optical apparatus used between the laser diode 10 and the pin diode 14 includes a collimator 46, a linear polarizer 48 and a polarization beam splitter 50. A lens required to focus the light on the pin diode 14 is not shown. The output of the laser diode 10 is directed to the collimator 46 with the output of the collimator presented to the linear polarizer 48 which has its output directed to the polarization beam splitter 50. The beam splitter 50 is used to direct a portion of the output from the polarizer 48 to the pin diode 14 at an angle of ninety degrees to the main beam. The amount of light split off for the pin diode 14 can be adjusted by rotating the polarization beam splitter 50. The polarization axis of the linear polarizer 48 is aligned parallel to the axis of polarization of the light from the laser diode 10. The arrangement of FIG. 2 avoids the problems associated with arrangements using light from the back facet of the laser diode for the pin diode when continuous monitoring of the laser diode output is desired. One problem that is avoided is the change that occurs in the proportionality constant relating to the light power outputs between front and back facets of a laser diode. The problem presented by differences in intensity fluctuations between the front and back facets when there are intensity fluctuations due to mode "hopping" is also avoided by the FIG. 2 arrangement wherein a portion of the light from the front facet of the laser diode is directed to the pin diode. The present arrangement, which uses the linear polarizer 48 upstream of the polarization beam splitter 50, also avoids increases and decreases in the feedback portion of the laser diode light output at the expense of the remaining portion of the beam due to polarization angle changes which can occur along with intensity fluctuations caused by mode "hopping". If the linear polarizer 48 provided by the arrangement of FIG. 2 were not used, any alteration of the polarization angle due to mode "hopping" would cause the proportion of light that is directed to the pin diode 14 to be altered. If the polarization angle change is in the direction that reduces (increases) the proportion of the light received by the pin diode, the usable portion of the light is increased (decreased). The feedback circuitry would then respond to a reduction (increase) in the light received by the pin diode to increase (decrease) the output of the laser diode when the output of the laser diode should actually be decreased (increased). By using the linear polarizer 48 any polarization angle change due to mode "hopping" merely causes a change in the light intensity from the linear polarizer 48 and does not alter the proportion of the light that is received by the pin diode 14 so that any polarization angle changes due to mode "hopping" are seen only as intensity changes as far as the optics downstream from the linear polarizer are concerned. Proper correction for intensity changes will be made in the laser diode output by the feedback circuitry.

While the invention has been described in connection with an exemplary embodiment thereof, it will be understood that many modifications thereof will be readily apparent to those of ordinary skill in the art; and that this specification is intended to cover any adaptations or variations thereof. Therefore, it is manifestly intended that this invention be only limited by the claims and the equivalents thereof.

What is claimed is:

1. Circuitry and apparatus for stabilizing the output of a laser diode allowing the laser diode to be modulated by a wideband analog signal including:
   a laser diode;
   means operatively arranged for receiving the analog signal for modulating the output of said laser diode, said means including a high gain amplifier having two inputs, one input operatively connected for receiving the signal for modulating said laser diode, the other input for receiving a feedback signal;
   a compensating network connecting the output of said high gain amplifier to said laser diode;
   a feedback circuit connected to provide a feedback voltage signal to said other input of said high gain amplifier, said feedback circuit including a pin diode;
   means for optically coupling said pin diode to the laser diode for providing a portion of the light output from said laser diode to said pin diode.

2. Circuitry and apparatus according to claim 1 wherein said feedback circuit includes a resistor, capacitor and a unity gain buffer amplifier connected in a positive feedback arrangement to minimize the effects of the junction capacitance of said pin diode, thereby extending the frequency response.

3. Circuitry and apparatus according to claim 1 wherein said compensating network includes a resistor connected between the output of said high gain amplifier and said laser diode and a capacitor connected in parallel with said resistor, said resistor having a value that is greater than the sum of the output impedance of said high gain amplifier and the dynamic impedance of said laser diode and said capacitor having a value that provides a zero in the open-loop gain for cancelling a pole due to the response of said pin diode.

4. Circuitry and apparatus according to claim 1 wherein said first-mentioned means includes a bias network operatively connected to said one input of said high gain amplifier for providing a d.c. offset sufficient to keep said laser diode operating with said laser diode output dropping to its threshold level when the analog signal for modulating said laser diode goes to zero.

5. Circuitry and apparatus according to claim 1 wherein said last-mentioned means includes a collimator, linear polarizer and a polarization beam splitter positioned in that order between said laser diode and said pin diode for directing a portion of the light output from said laser diode to said pin diode with said collimator positioned to receive the light output from said laser diode.

6. Circuitry and apparatus according to claim 5 wherein the axis of said linear polarizer is aligned parallel to the axis of polarization of light from said collimator.

* * * * *